United States Patent [19]
Ryat

[11] Patent Number: 5,293,136
[45] Date of Patent: Mar. 8, 1994

[54] TWO-STAGE RAIL-TO-RAIL OPERATIONAL AMPLIFIER

[75] Inventor: Marc H. Ryat, Santa Clara, Calif.

[73] Assignee: SGS-Thomson Microelectronics, Inc., Carrollton, Tex.

[21] Appl. No.: 946,764

[22] Filed: Sep. 17, 1992

[51] Int. Cl.$^5$ .............................................. H03F 3/45
[52] U.S. Cl. ................................... 330/258; 330/253; 330/255; 330/257
[58] Field of Search ............... 330/252, 253, 255, 257, 330/258

[56] References Cited

U.S. PATENT DOCUMENTS

| | | | |
|---|---|---|---|
| 4,667,165 | 5/1987 | De Weck | 330/258 X |
| 4,909,953 | 2/1990 | McCormack | 330/258 |
| 5,006,817 | 4/1991 | Babanezhad | 330/258 |
| 5,015,966 | 5/1991 | McIntyre | 330/258 X |

OTHER PUBLICATIONS

R. J. Wildar, "Low-voltage techniques", IEEE Jour. Solid State Cir., vol. SC-13, pp. 836–846, Dec. 1978.
Huijsing et al., "Low-voltage operational amplifier with rail-to-rail input and output ranges", IEEE J. Solid State Cir., vol. SC-20, No. 6, pp. 1144–1150, Dec. 1985.
Fonderie et al., IEEE J. Solid State Cir., vol. SC-24, No. 6, pp. 1551–1559, Dec. 1989.
Callewaert et al, "Class AB CMOS amplifiers with high efficiency", IEEE J. Solid State Cir., vol. 25, No. 3, pp. 684–692, Jun. 1990.
Brehmer et al., "Large-swing CMOS power amplifier", IEEE J. Solid State Cir., vol. SC-18, pp. 624–629, Dec. 1983.
Fisher, "A high-performance CMOS power amplifier", IEEE J. Solid State Cir., vol. SC-20, No. 6, pp. 1200–1205, Dec. 1985.
Monticelli, "A quad CMOS single-supply op amp with rail-to-rail output swing", IEEE J. Solid State Cir., vol. SC-21, No. 6, pp. 1026–1034, Dec. 1986.
Fisher, "A highly linear CMOS buffer amplifier", IEEE J. Solid State Cir., vol. SC-22, No. 3, pp. 330–334, Jun. 1987.
Steyaier et al., "A high–dynamic–range CMOS op amp with low–distortion output structure", IEEE J. Solid State Cir., vol. SC-22, No. 6, pp. 1204–1207, Dec. 1987.
Babenezhad, "A rail-to-rail CMOS op amp", IEEE J. Solid State Cir., vol. SC-23, No. 6, pp. 1414–1417, Dec. 1988.

(List continued on next page.)

Primary Examiner—James B. Mullins
Attorney, Agent, or Firm—Richard A. Bachand; Lisa K. Jorgenson; Richard K. Robinson

[57] ABSTRACT

A two-stage class-AB operational amplifier, that can be implemented either with bipolar or MOS transistors, includes a differential input circuit adapted to receive a differential input signal to produce an amplified differential output signal for application to first and second nodes. The differential input stage has a common-mode control circuit that produces first and second common-mode control voltages on the first and second nodes. The common-mode control voltages are combined with the amplified differential output signal on the first and second nodes to produce a first stage differential output signal. A high-swing output stage is connected to receive the first stage differential output signal. First and second current mirrors each have a mirror transistor to mirror an output current produced in response to the differential input signals on respective lines including the first and second nodes. The common-mode control circuit is in series with mirror transistors of the first and second current mirrors. A circuit clamps the first and second nodes at a voltage of $2V_{BE}$ below the supply voltage, and clamps the voltage at the second node at a voltage of $2V_{BE}$ above the reference potential, enabling the circuit to operate with improved power-supply rejection ratios.

28 Claims, 3 Drawing Sheets

OTHER PUBLICATIONS

Pardoen et al. "A rail-to-rail input/output CMOS power amplifier", IEEE J. Solid State Cir., vol. SC-25, No. 2, pp. 501-504, Apr. 1990.

Babanezhad et al., "A programmable gain/loss circuit", IEEE J. Solid State Cir., vol. SC-22, No. 6, pp. 1082-1090, Dec. 1987.

Nagaraj, "Large-swing CMOS buffer amplifier", IEEE J. Solid State Cir., vol. SC-24, pp. 181-183, Feb. 1989.

Mistlberger et al., "Class-AB high-swing CMOS power amplifier", IEEE J. Solid State Cir., vol. SC-27, No. 7, pp. 1089-1092, Jul. 1992.

Malhi et al., "A low-voltage micropower JFET/bipolar operational amplifier", IEEE J. Solid State Cir., vol. SC-16, No. 6, pp. 669-676, Dec. 1981.

Davis et al., "Design techniques for improving the HF response of a monolithic JFET operational amplifier", IEEE J.S. State Cir., vol. SC-19, No. 6, pp. 978-985, Dec. 1984.

Vyne et al., "A monolithic P-channel JFET quad op amp with in-package trim and enhanced gain-bandwidth product", IEEE J.S. State Cir., vol. SC-22, No. 6, pp. 1130-1138, Dec. 1987.

Seevinck et al., "A low-distortion output stage with improved stability for monolithic power amplifiers", IEEE J. Solid State Cir., vol. SC-23, No. 3, pp.794-801, Jun. 1988.

Widlar et al., "A monolithic power op amp", IEEE J.S. State Cir., vol. SC-23, No. 2, pp. 527-535, Apr. 1988.

Quiting, "A CMOS power amplifier with a novel output structure", IEEE J. Solid State Cir., vol. SC-27, No. 2, pp. 203-207, Feb. 1992.

Fondirie et al., "Operational amplifier with 1-V rail-to-rail multipath-driven Output Stage", IEEE J. Solid State Cir., vol. 26, No. 12, Dec. 1991.

Gilbert, "A new wide-band amplifier technique", IEEE J. Solid State Cir., vol. SC-3, No. 4, Dec. 1968.

Castello et al., "A high-performance micropower switched-capacitor Filter", IEEE J. Solid State Cir., vol. SC-20, No. 6, Dec. 1985.

Fiez et al., "A family of high-swing CMOS operational amplifiers", IEEE J. Solid State Cir., vol. 24, No. 6, pp. 1683-1687, Dec. 1989.

Op't Eynde et al., "A CMOS large-swing low-distortion three-stage class AB power amplifier", IEEE J. Solid State Cir., pp. 265-273, vol. 25, No. 1, Feb. 1990.

Lee et al., "A high slwe-rate CMOS amplifier for analog signal processing", IEEE J. Solid State Cir., vol. 25, No. 3, pp. 885-889, Jun. 1990.

TWO-STAGE RAIL-TO-RAIL OPERATIONAL AMPLIFIER

CROSS-REFERENCE TO RELATED APPLICATIONS

This application is related to U.S. patent application Ser. No. 07/946,765, filed Sep. 17, 1992, incorporated herein by reference.

BACKGROUND OF THE INVENTION

1. Field of the Invention

This invention relates to improvements in operational amplifiers, and more particularly to improvements in operational amplifiers that have wide input/output voltage ranges approaching rail-to-rail swings, and still more particularly to common-mode current handling and power supply rejection ratio techniques in operational amplifiers of this type.

2. Background Information

Recently, increased interest has been directed towards realizing low distortion class-AB operational amplifiers that have a wide range of input and output voltages, approaching the upper and lower supply rail voltages. It is desirable, of course that the amplifier be capable of being realized in a monolithic integrated circuit structure of bipolar or MOS transistor devices.

An example of a typical operational amplifier circuit is shown by Johan H. Huijsing et al., in "Low-Voltage Operational Amplifier with Rail-to-Rail Input and Output Ranges" *IEEE Journal of Solid-State Circuits*, Vol. SC-20, No. 6, December, 1985, in which an operational amplifier is advanced that can operate with a supply voltage as low as 1.5 volts. The output voltage can reach the supply rail within 150 mV. The circuit has an input stage that provides rail-to-rail common-mode voltage range and an output stage with rail-to-rail output-voltage swing with accurate class-AB control. The circuit, however, requires an intermediate stage to enable the input and output stages to be connected together to produce sufficient voltage gain to enable the circuit to be used as a general purpose operational amplifier. The provision of the third stage not only increases the size and complexity of the circuit, it reduces the circuit bandwidth and speed.

Jeroen Fonderie et al., in "1-V Operational Amplifier with Rail-to-Rail Input and Output Ranges", *IEEE Journal of Solid-State Circuits*, Vol. 24, No. 6, December, 1989, shows a bipolar operational amplifier with rail-to-rail input and output ranges for low supply voltages. This circuit again requires a large number of components and an intermediate stage between the input and output stages. Being a three-stage design, its composition is relatively complicated, and has a bandwidth limited to approximately 450 kHz in the technology used.

BRIEF DESCRIPTION OF THE DRAWING

The invention is illustrated in the accompanying drawing in which.

In the various figures of the drawing, like reference numerals are used to denote like or similar parts.

SUMMARY OF THE INVENTION

Figure 1:
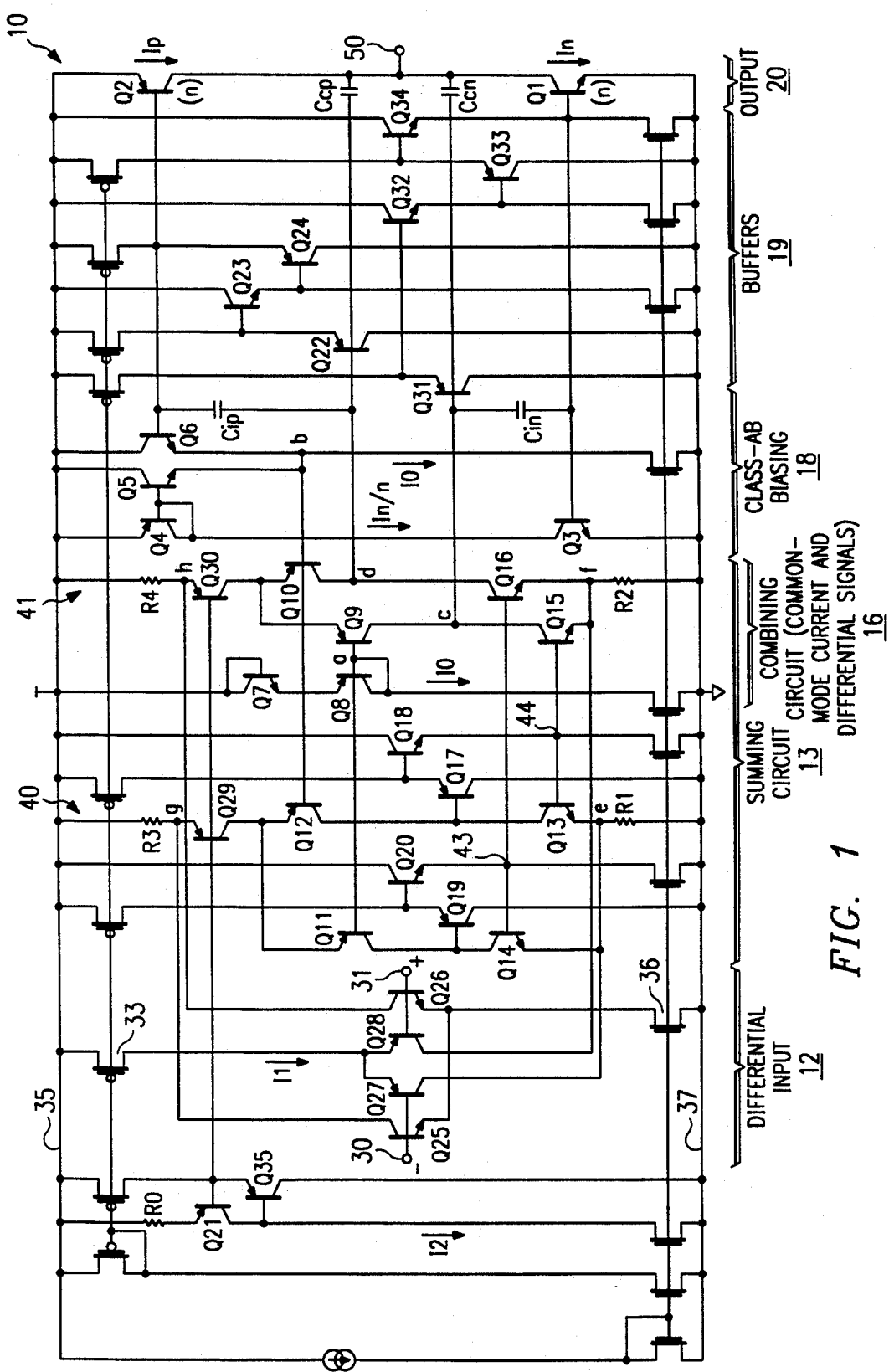
FIG. 1 is an electrical schematic diagram of a two-stage class-AB operational amplifier implemented with bipolar transistors, in accordance with a preferred embodiment of the invention.

In light of the above, it is, therefore, an object of the invention to provide an improved operational amplifier.

It is another object of the invention to provide an improved operational amplifier that can be realized in or implemented in two stages. It is another object of the invention to provide an operational amplifier of the type described that can be implemented with a minimum of components.

It is another object of the invention to provide an improved operational amplifier of a size smaller than similar circuits in the prior art, and, therefore, can be monolithically integrated onto a semiconductor substrate without requiring as much area as required by prior art circuits of the same type.

It is another object of the invention to provide an improved operational amplifier of the type described in which currents flowing in class-AB control mode transistors are controlled by input signal carrying transistors, and, therefore, do not need special control or regulation devices or circuits.

It is another object of the invention to provide an improved operational amplifier that can be implemented using MOS transistors in a minimum size.

These and other objects, features and advantages of the invention will be apparent to those skilled in the art from the following detailed description of the invention, when read in conjunction with the accompanying drawings and appended claims.

In accordance with a broad aspect of the invention, an operational amplifier is presented that includes a differential input circuit adapted to receive a differential input signal to produce an amplified differential output signal for application to first and second nodes. The differential input stage has a common-mode control circuit that produces first and second common-mode control voltages on the first and second nodes. The common-mode control voltages are combined with the amplified differential output signal on the first and second nodes to produce a first stage differential output signal. A high-swing output stage is connected to receive the first stage differential output signal.

In another aspect of the invention, the operational amplifier circuit additionally includes first and second current mirrors. Each mirror has a mirror transistor to mirror an output current produced in response to the differential input signals on respective lines including the first and second nodes. The common-mode control circuit is in series with mirror transistors of the first and second current mirrors.

The operational amplifier circuit can be implemented either with bipolar or MOS transistors.

In accordance with another broad aspect of the invention, an operational amplifier of the type described is presented that includes a circuit for clamping the first and second nodes at a predetermined level with respect to the supply voltage and reference potential. The circuit for clamping the first and second nodes at a predetermined level with respect to the supply voltage and reference potential clamps the voltage at the first node at a voltage of $2V_{BE}$ below the supply voltage, and clamps the voltage at the second node at a voltage of $2V_{BE}$ above the reference potential. This enables the circuit to operate with an improved power supply rejection ratio.

In accordance with still another broad aspect of the invention, a two-stage class-AB operational amplifier is presented that includes a differential input circuit adapted to receive a differential input signal to produce an amplified differential output signal on first and second nodes. The differential input stage has a common-mode control circuit that produces first and second common-mode control voltages on the first and second nodes, whereby the common-mode control voltages are combined with the amplified differential output signal on the first and second nodes to produce a first stage differential output signal. A high-swing output stage is connected to receive the first stage differential output signal, the high-swing output stage including a buffer stage connected to receive the first stage differential output signal and a pair of output transistors connected to produce an operational amplifier output, and a class-AB mode biasing circuit for biasing the pair of output transistors.

DETAILED DESCRIPTION OF THE PREFERRED EMBODIMENTS

An electrical schematic diagram of an operational amplifier 10 in accordance with a preferred embodiment of the invention is shown in FIG. 1. The operational amplifier 10 is constructed of bipolar transistors, and, as will become apparent, is a two-stage class-AB operational amplifier having a minimum number of components that can be realized in a monolithic integrated circuit of minimum size.

The operational amplifier 10 includes a differential input stage 12 that provides outputs to a summing circuit 13. A portion of summing circuit 13 is employed as a combining circuit 16 that combines the common-mode current and the differential signals from the differential input section 12. The differential input 12, summing circuit 13, and combining circuit 16 constitute the first stage of the two-stage operational amplifier 10.

The output from the first stage is derived at high impedance nodes "c" and "d" to be buffered in the buffers section 19 for application to the output stage 20. The transistors of the output stage 20 are biased in class-AB mode by class-AB biasing circuit 18.

More particularly, the differential input stage 12 includes two pairs of transistors of opposite conductivity type. NPN transistor Q25 and PNP transistor Q27 are connected with their bases adapted to receive the inverting side of a differential input signal on node 30. In a similar fashion, the PNP transistor Q28 and NPN transistor Q26 have their bases connected to receive a non-inverting portion of a differential input signal applied to node 31. The emitters of PNP transistors Q27 and Q28 are connected to a current source 33 that is connected to the high side or $V_{cc}$ rail 35 (herein the supply rail 35). In a similar fashion, the emitters of NPN transistors Q25 and Q26 are connected to a current source 36 that is connected, in turn, to the low side, or reference potential, or analog ground rail 37 (herein the ground rail 37). The outputs from the differential input 12 are derived from the collectors of the transistors Q25-Q28 and the sunning circuit 13.

The summing circuit 13 includes two current paths 40 and 41 to sum the currents developed in the differential input stage 12. The current path 40 includes a resistor R3 connected between the supply rail 35 and the emitter of a PNP transistor Q29. The collector of the NPN transistor Q25 of the differential input stage 12 is connected to node "g" between the resistor R3 and the emitter of the PNP transistor Q29. The collector of the PNP transistor Q29 is connected to the collector of NPN transistor Q13 through the current flow path of bias transistor Q12. The base of the PNP transistor Q29 is connected to the emitter of a PNP transistor Q35 to mirror the current in the biasing current path including the PNP transistor Q21 and resistor RO.

The emitter of the NPN transistor Q13 is connected to a resistor R1 that is connected, in turn, to the ground rail 37. The collector of the PNP transistor Q27 of the differential input stage 12 is connected at node "e" between the emitter of the NPN transistor Q13 and resistor R1.

In addition, input stage transistors Q11 and Q14 are connected with their emitters respectively to the collectors of PNP transistor Q29 and PNP transistor Q27. The base and collector of the NPN transistor Q14 are interconnected through the emitter-follower circuits formed by NPN transistor Q20 and PNP transistor Q19. Thus, it will be seen that the node 43 follows the potential that exists on the collector of the NPN transistor Q14. Moreover, the current flowing in the NPN transistor Q14 is mirrored in the NPN transistor Q16 in the current flow path 41, the base of NPN transistor Q16 also being connected to node 43.

In addition to the foregoing, the base and collector of NPN transistor Q13 are interconnected by the PNP transistor Q17 and NPN transistor Q18 connected in emitter-follower configuration. Thus, the voltage on node 44 follows the voltage that appears on the collector of the NPN transistor Q13. The current that flows through the NPN transistor Q13 is mirrored in the NPN transistor Q15, the base of which is also connected to the node 44.

With reference now to the current flow path 41, the current flow path 41 is formed with a resistor R4 connected between the supply rail 35 and the emitter of a PNP transistor Q30. The collector of the PNP transistor Q30 is connected to the collector of NPN transistor Q16 via the current flow path of PNP transistor Q10. The base of the PNP transistor Q30 is connected to the emitter of PNP biasing transistor Q35.

The bases of the PNP transistors Q10 and Q12 are connected to node "b" in the class-AB biasing circuit 18, below described. The NPN transistor Q16 has its emitter connected to the ground rail 37 by a resistor R2.

With reference once again to the differential input circuit 12, the collector of PNP transistor Q26 is connected to node "h" between the resistor R4 and the emitter of PNP transistor Q30. Likewise, the collector of the PNP transistor Q28 is connected at node "f" between the emitter of the NPN transistor Q16 and resistor R2.

The class-AB biasing circuit 18 includes a current path including a PNP transistor Q4 and NPN transistor Q3 connected between the supply rail 35 and ground rail 37. The base of the NPN transistor Q3 is connected to the base of the lower output transistor Q1. The NPN transistor Q3 has an emitter that is sized with respect to the emitter of the lower output transistor Q1 to have a ratio n, whereby the output current In flowing through the output transistor Q1 is mirrored in the transistor Q3, but with a magnitude determined by the emitter ratio n, namely in/n.

A second NPN transistor Q5 is provided between the supply rail 35 and node "b". The base of the NPN transistor Q5 is connected to the base of the PNP transistor Q4. In addition, an NPN transistor Q6 is provided between the supply rail 35 and the node "b", the base of which is connected to the base of the upper output PNP transistor Q2. Thus, the current flowing from node "b" to the ground rail 37 is a reference current IO. As mentioned, the bases of PNP transistors Q12 and Q10 are connected to the emitters of NPN transistors Q5 and Q6 at node "b". Thus, the reference current IO affects the common-mode current flowing in the summing circuit 13 as described above.

Thus, it will be seen that the currents flowing in NPN transistors Q14 and Q13 as a result of the signal in current path 40 are mirrored by the currents in the NPN transistors Q15 and Q16, respectively. Moreover, it will be appreciated that the combining circuit 16 develops a common-mode current by virtue of the reference current developed in NPN transistor Q7 and PNP transistor Q8 as well as a reference current flowing through NPN transistor Q6 and NPN transistor Q5, summed at node "b" in the class-AB biasing section 18. Thus, the currents developed through PNP transistors Q9 and Q10 subtract with the differential signals developed on NPN transistors Q15 and Q16 on nodes c and "d".

The outputs on the high impedance nodes "c" and "d" are applied to the output transistors Q2 and Q1 by the buffer circuit 19. More particularly, the signal on the high impedance node "c" is connected to the lower output transistor Q1 by transistors Q31, Q32, Q33, and Q34, connected in emitter-follower configuration. Similarly, the signal on high impedance node "d" is connected to the base of the upper output transistor Q2 by transistors Q22, Q23, and Q24, also connected in emitter-follower configuration.

Finally, the output is developed on a node 50 of the output stage 20. The output stage 20 includes an upper PNP "push" transistor Q2 and a lower NPN "pull" transistor Q1. The transistors Q1 and Q2 are connected in "quasi-rail-to-rail" configuration, as shown.

Broadly, with respect to the circuit of FIG. 1, it will be appreciated that the circuit accomplishes a two-stage amplifier circuit requiring fewer components than required heretofore, while approaching high speed rail-to-rail input and output operation.

Figure 2:
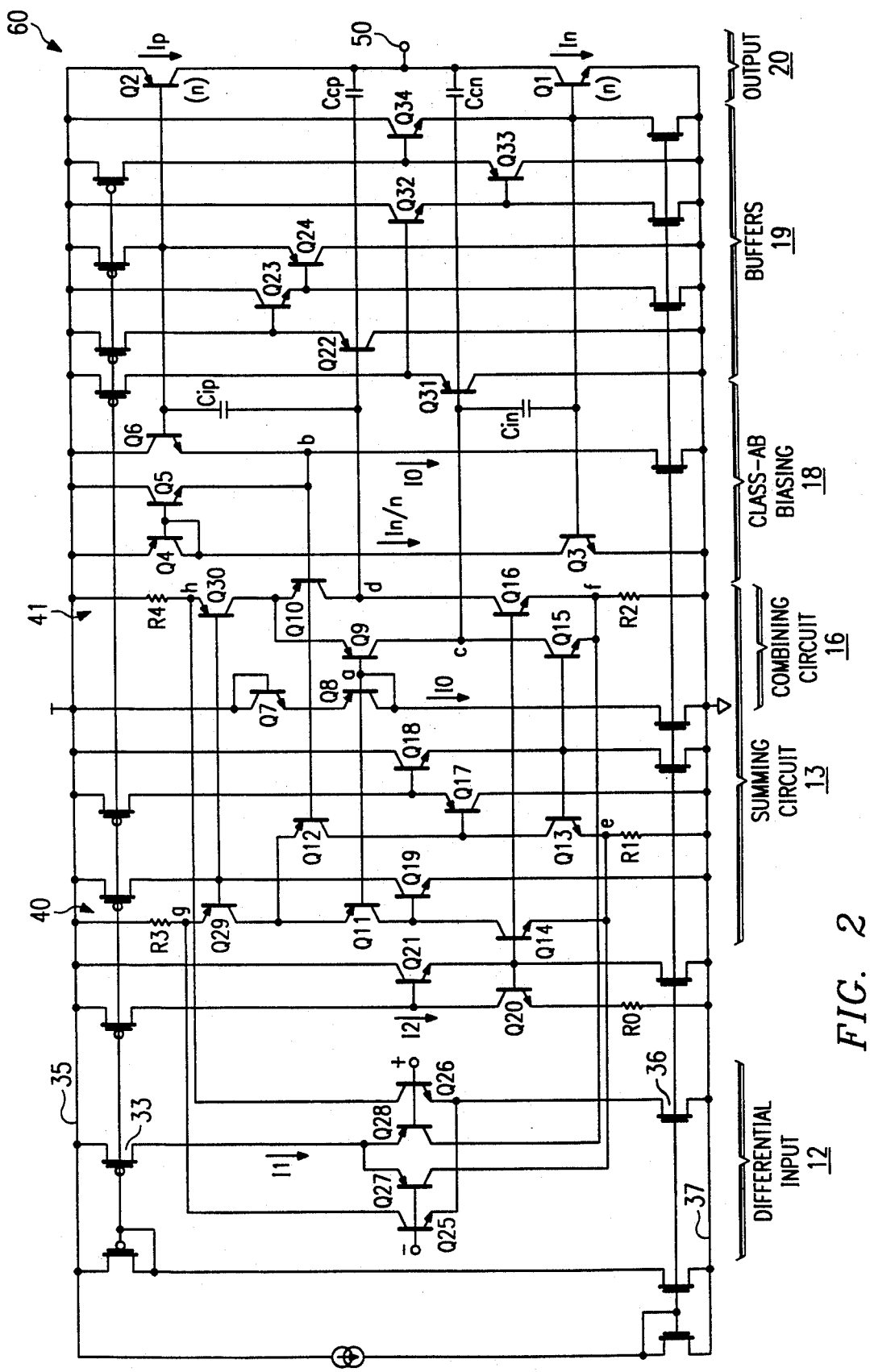
FIG. 2 is an electrical schematic diagram of a two-stage class-AB operational amplifier implemented with bipolar transistors that has an improved power supply rejection ratio, in accordance with another preferred embodiment of the invention.

An electrical schematic diagram of a bipolar amplifier circuit that has been modified from the FIG. 1 embodiment is shown in FIG. 2. The operational amplifier embodiment 60 of FIG. 2 is similar to the operational amplifier embodiment 10 of FIG. 1, except that the FIG. 2 embodiment has an improved power supply rejection ratio (PSRR). The improved PSRR in the FIG. 2 embodiment is accomplished by clamping the voltage on the collectors of Q11 and Q12 to a predetermined voltage, in the embodiment illustrated, $2V_{BE}$ below the supply rail voltage and $2V_{BE}$ above the ground rail voltage. Since node "c" and "d" also are clamped at $2V_{BE}$ above the ground rail voltage and $2V_{BE}$ below the upper rail voltage, the collectors of Q11 and Q12 follow the voltages on "c" and "d" when the supplies vary.

In order to achieve the voltage clamp, in contrast to the FIG. 1 embodiment, the PNP transistor Q19 is connected to the base of PNP transistor Q29 in the mirror circuit including PNP transistors Q29 and Q30. Thus, the voltage on the collector of Q11 is $2V_{BE}$ below the voltage on the supply rail 35 due to the $V_{BE}$ drops across the PNP transistors Q19 and Q29. In addition, the collector of Q12 is at $1V_{BE}$ above the ground rail 37, thus following node "c" when the supply varies.

Figure 3:
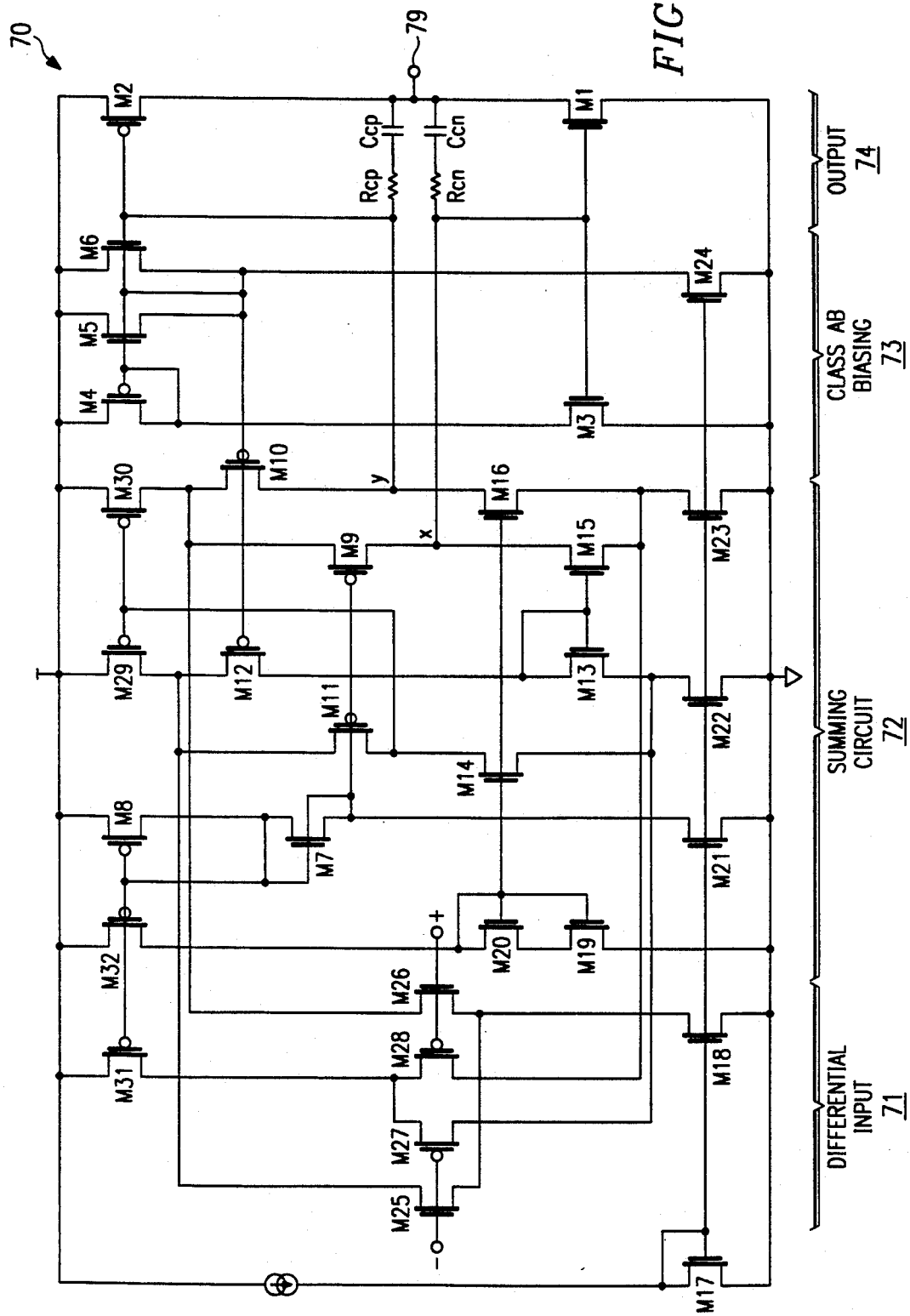
FIG. 3 is an electrical schematic diagram of a two-stage class-AB operational amplifier implemented with MOS transistors, in accordance with yet another preferred embodiment of the invention.

An electrical schematic diagram of an operational amplifier embodiment 70 implemented using MOS devices is shown in FIG. 3. The operational amplifier 70 includes a differential input stage 71 that provides differential input signals to a summing circuit 72. The output nodes from the first amplifier stage including the differential input 71 and summing circuit 72 are developed on nodes "x" and "y" in the same fashion as described above with reference to the operational amplifier embodiments 10 and 60 in FIGS. 1 and 2. The output from the operational amplifier 70 is developed on node 79 from the output stage 74. The output stage 74 is biased by class-AB biasing circuit 73. The overall operation of the operational amplifier circuit 70 of FIG. 3 is similar to that described above with reference to the operational amplifier 60 described in FIG. 2 above.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An operational amplifier, comprising:
   a differential input circuit adapted to receive a differential input signal to produce an amplified differential output signal for application to first and second nodes;
   said differential input circuit having a common-mode control circuit that produces first and second common-mode control voltages on said first and second nodes, whereby said common-mode control voltages are combined with said amplified differential output signal on said first and second nodes to produce a first stage differential output signal;
   and a high-swing output stage connected to receive the first stage differential output signal.

2. The operational amplifier of claim 1 further comprising first and second current mirrors each having a mirror transistor to mirror an output current produced in response to said differential input signals on respective lines including said first and second nodes, and wherein said common-mode control circuit is in series with mirror transistors of said first and second current mirrors.

3. The operational amplifier of claim 2 wherein the common-mode control voltages are multiplied with said differential input signal on said first and second nodes.

4. The operational amplifier of claim 2 wherein said high-swing output stage comprises a buffer stage connected to receive said first stage differential output signal and a pair of output transistors connected to produce an operational amplifier output.

5. The operational amplifier of claim 4 further comprising a class-AB mode being circuit for biasing said pair of output transistors.

6. The operational amplifier of claim 4 wherein said differential input circuit comprises a first pair of transistors of opposite conductivity type having control elements connected to receive one side of the differential input signal, and a second pair of transistors of opposite conductivity type having control elements connected to receive another side of the differential input signal.

7. The operational amplifier of claim 6 wherein said differential input circuit further comprises first and second current sources connected respectively between transistors of said first and second transistor pairs of a first conductivity type and a voltage supply, and between transistors of said first and second transistor pairs of a second conductivity type and a reference potential.

8. The operational amplifier of claim 4 wherein said operational amplifier is implemented with bipolar transistors.

9. The operational amplifier of claim 4 wherein said operational amplifier is implemented with MOS transistors.

10. An operational amplifier, comprising:
a differential input circuit adapted to receive a differential input signal to produce an amplified differential output signal on first and second nodes;
said differential input circuit having a common-mode control circuit that produces first and second common-mode control voltages on said first and second nodes, whereby said common-mode control voltages are combined with said amplified differential output signal on said first and second nodes to produce a first stage differential output signal;
a circuit for clamping the first and second nodes at a predetermined level with respect to the supply voltage and reference potential;
and a high-swing output stage connected to receive the first stage differential output signal.

11. The operational amplifier of claim 10 wherein the common-mode control voltages are multiplied with said differential input signal on said first and second nodes.

12. The operational amplifier of claim 10 wherein said circuit for clamping the first and second nodes at a predetermined level with respect to the supply voltage and reference potential clamps the voltage at the first node at a voltage of $2V_{BE}$ below the supply voltage, and clamps the voltage at the second node at a voltage of $2V_{BE}$ above the reference potential.

13. The operational amplifier of claim 12 further comprising first and second current mirrors each having a mirror transistor to mirror an output current produced in response to said differential input signals on respective lines including said first and second nodes, and wherein said common-mode control circuit is in series with mirror transistors of said first and second current mirrors.

14. The operational amplifier of claim 12 wherein said high-swing output stage comprises a buffer stage connected to receive said first stage differential output signal and a pair of output transistors connected to produce an operational amplifier output.

15. The operational amplifier of claim 14 further comprising a class-AB mode biasing circuit for biasing said pair of output transistors.

16. The operational amplifier of claim 15 wherein said differential input circuit comprises a first pair of transistors of opposite conductivity type having control elements connected to receive one side of the differential input signal, and a second pair of transistors of opposite conductivity type having control elements connected to receive another side of the differential input signal.

17. The operational amplifier of claim 16 wherein said differential input circuit further comprises first and second current sources connected respectively between transistors of said first and second transistor pairs of a first conductivity type and a voltage supply, and between transistors of said first and second transistor pairs of a second conductivity type and a reference potential.

18. The operational amplifier of claim 17 wherein said operational amplifier is implemented with bipolar transistors.

19. The operational amplifier of claim 17 wherein said operational amplifier is implemented with MOS transistors.

20. A two-stage class-AB operational amplifier, comprising:
a differential input circuit adapted to receive a differential input signal to produce an amplified differential output signal on first and second nodes;
said differential input circuit having a common-mode control circuit that produces first and second common-mode control voltages on said first and second nodes, whereby said common-mode control voltages are combined with said amplified differential output signal on said first and second nodes to produce a first stage differential output signal;
and a high-swing output stage connected to receive the first stage differential output signal, said high-swing output stage including a buffer stage connected to receive said first stage differential output signal and a pair of output transistors connected to produce an operational amplifier output, and a class-AB mode biasing circuit for biasing said pair of output transistors.

21. The two-stage class-AB operational amplifier of claim 20 wherein the common-mode control voltages are multiplied with said differential input signal on said first and second nodes.

22. The two-stage class-AB operational amplifier of claim 20 further comprising first and second current mirrors each having a mirror transistor to mirror an output current produced in response to said differential input signals on respective lines including said first and second nodes, and wherein said common-mode control circuit is in series with mirror transistors of said first and second current mirrors.

23. The two-stage class-AB operational amplifier of claim 20 further comprising a circuit for clamping the first and second nodes at a predetermined level with respect to the supply voltage and reference potential;

24. The two-stage class-AB operational amplifier of claim 23 wherein said circuit for clamping the first and second nodes at a predetermined level with respect to the supply voltage and reference potential clamps the voltage at the first node at a voltage of $2V_{BE}$ below the supply voltage, and clamps the voltage at the second node at a voltage of $2V_{BE}$ above the reference potential.

25. The two-stage class-AB operational amplifier of claim 20 wherein said differential input circuit comprises a first pair of transistors of opposite conductivity type having control elements connected to receive one side of the differential input signal, and a second pair of transistors of opposite conductivity type having control elements connected to receive another side of the differential input signal.

26. The two-stage class-AB operational amplifier of claim 25 wherein said differential input circuit further comprises first and second current sources connected respectively between transistors of said first and second transistor pairs of a first conductivity type and a voltage supply, and between transistors of said first and second transistor pairs of a second conductivity type and a reference potential.

27. The two-stage class-AB operational amplifier of claim 20 wherein said operational amplifier is implemented with bipolar transistors.

28. The two-stage class-AB operational amplifier of claim 20 wherein said operational amplifier is implemented with MOS transistors.

* * * * *